United States Patent [19]
Coffinberry

[11] Patent Number: 5,891,584
[45] Date of Patent: *Apr. 6, 1999

[54] COATED ARTICLE FOR HOT HYDROCARBON FLUID AND METHOD OF PREVENTING FUEL THERMAL DEGRADATION DEPOSITS

[75] Inventor: George A. Coffinberry, West Chester, Ohio

[73] Assignee: General Electric Company, Cincinnati, Ohio

[*] Notice: This patent issued on a continued prosecution application filed under 37 CFR 1.53(d), and is subject to the twenty year patent term provisions of 35 U.S.C. 154(a)(2).

[21] Appl. No.: 819,015

[22] Filed: Mar. 17, 1997

Related U.S. Application Data

[63] Continuation of Ser. No. 592,248, Jan. 26, 1996, abandoned, which is a continuation of Ser. No. 125,633, Sep. 23, 1993, abandoned, which is a continuation-in-part of Ser. No. 949,593, Sep. 22, 1992, abandoned, which is a continuation-in-part of Ser. No. 673,924, Mar. 25, 1991, abandoned.

[51] Int. Cl.[6] .............................. F02B 77/04; C23C 16/40
[52] U.S. Cl. ..................... 428/552; 428/553; 428/565; 123/668; 123/670; 208/48 R; 427/126.3; 427/248.1; 427/255; 585/550
[58] Field of Search .............................. 427/126.3, 248.1, 427/255; 431/3; 123/668, 670; 203/7, 8, 9; 208/48 R; 422/241, 312; 585/950; 428/548, 551, 552, 553, 565

[56] References Cited

U.S. PATENT DOCUMENTS

| | | | |
|---|---|---|---|
| 1,869,077 | 7/1932 | Prentice | 123/668 |
| 2,044,416 | 6/1936 | Atwell | 202/36 |
| 2,433,943 | 1/1948 | Zwicky et al. | 60/35.6 |
| 2,542,953 | 2/1951 | Williams, Jr. | 60/41 |
| 2,698,512 | 1/1955 | Schirmer et al. | 60/209 |

(List continued on next page.)

FOREIGN PATENT DOCUMENTS

| | | | |
|---|---|---|---|
| 0022349 | 1/1981 | European Pat. Off. | |
| 0038212 | 10/1981 | European Pat. Off. | |
| 2662704 | 12/1991 | France | 208/48 R |
| 1518875 | 9/1969 | Germany | |
| 3928480 | 4/1990 | Germany | 123/668 |
| 61-178514 | 8/1986 | Japan | 123/668 |
| 1141909 | 10/1969 | United Kingdom | |

OTHER PUBLICATIONS

English translation of Laid Open Patent Application JP57-12829 (Laid Open Date: Jan. 22, 1982).

(List continued on next page.)

*Primary Examiner*—Kathryn L. Gorgos
*Assistant Examiner*—Chrisman D. Carroll
*Attorney, Agent, or Firm*—Andrew C. Hess; David L. Narciso

[57] ABSTRACT

Articles for hot hydrocarbon fluid wherein the surface for contacting the fluid is a diffusion barrier material or a catalytic material coated on a metal substrate. The material is either catalytically-inactive tantalum oxide which inhibits the formation of coke in the fluid or catalytically-active zirconium oxide which promotes the formation of a loosely adherent coke in the fluid while inhibiting the formation of gum in the fluid. The coating materials, i.e., the diffusion barrier coating material and the catalytic coating material, are deposited by chemical vapor deposition (CVD), e.g., by effusive chemical vapor deposition of an organometallic compound on the surface without the use of carrier gas, without pre-oxidation of the surface and without thermal decomposition of the diffusion barrier material or the catalytic coating material. The articles having the coated surfaces find utility in components subjected to high temperatures wherein the components are in contact with hydrocarbon fluids without additives, without special attention to quality control and without the need for special processing.

13 Claims, 6 Drawing Sheets

U.S. PATENT DOCUMENTS

| | | | |
|---|---|---|---|
| 2,782,592 | 2/1957 | Kolfenbach et al. | 60/209 |
| 2,794,316 | 6/1957 | Winternitz | 60/205 |
| 2,959,915 | 11/1960 | Dille et al. | 60/209 |
| 3,039,720 | 6/1962 | Torell | 244/74 |
| 3,049,872 | 8/1962 | Johnson et al. | 60/210 |
| 3,157,990 | 11/1964 | Ward | 60/218 |
| 3,164,955 | 1/1965 | Garraway | 650/35.3 |
| 3,173,247 | 3/1965 | Smith et al. | 60/35.4 |
| 3,177,656 | 4/1965 | Tick et al. | 60/35.6 |
| 3,234,580 | 2/1966 | Keck | 431/3 |
| 3,236,046 | 2/1966 | Wellman | 60/35.4 |
| 3,382,679 | 5/1968 | Spoerlein | 60/267 |
| 3,467,583 | 9/1969 | Naimer | 204/9 |
| 3,540,863 | 11/1970 | Priceman et al. | 29/191.2 |
| 3,667,221 | 6/1972 | Taylor | 60/39.74 R |
| 3,690,100 | 9/1972 | Wolf et al. | 60/206 |
| 3,691,762 | 9/1972 | Ryberg et al. | 60/39.51 R |
| 3,692,696 | 9/1972 | Kravitz et al. | 252/439 |
| 3,722,220 | 3/1973 | Wolf et al. | 60/267 |
| 3,733,826 | 5/1973 | Wolf et al. | 60/263 |
| 3,827,967 | 8/1974 | Nap et al. | 208/48 R |
| 3,861,141 | 1/1975 | Neuffer | 60/267 |
| 3,890,088 | 6/1975 | Ferri | 431/351 |
| 3,922,849 | 12/1975 | Kors et al. | 60/39.51 R |
| 3,940,923 | 3/1976 | Pfefferle | 60/39.06 |
| 3,973,395 | 8/1976 | Markowski et al. | 60/39.65 |
| 4,045,956 | 9/1977 | Markowski et al. | 60/39.65 |
| 4,078,604 | 3/1978 | Christl et al. | 165/133 |
| 4,084,371 | 4/1978 | Howald | 60/39.36 |
| 4,112,676 | 9/1978 | De Corso | 60/39.71 |
| 4,215,535 | 8/1980 | Lewis | 60/736 |
| 4,262,482 | 4/1981 | Roffe et al. | 60/736 |
| 4,297,150 | 10/1981 | Foster et al. | 148/6.3 |
| 4,343,658 | 8/1982 | Baker et al. | 148/6.3 |
| 4,408,461 | 10/1983 | Bruhwiler et al. | 60/737 |
| 4,429,527 | 2/1984 | Teets | 60/39.06 |
| 4,454,021 | 6/1984 | Watanabe et al. | 208/48 R |
| 4,480,436 | 11/1984 | Maclin | 60/39.32 |
| 4,529,626 | 7/1985 | Baker et al. | 427/226 |
| 4,530,340 | 7/1985 | Totman | 123/669 |
| 4,561,257 | 12/1985 | Kwan et al. | 60/737 |
| 4,563,875 | 1/1986 | Howald | 60/39.23 |
| 4,582,476 | 4/1986 | Altemark et al. | 431/8 |
| 4,612,880 | 9/1986 | Brass et al. | 123/1 A |
| 4,655,044 | 4/1987 | Dierberger et al. | 60/753 |
| 4,692,313 | 9/1987 | Watanabe et al. | 422/241 |
| 4,787,208 | 11/1988 | De Corso | 60/723 |
| 4,838,029 | 6/1989 | Gleason et al. | 60/732 |
| 4,893,468 | 1/1990 | Hines | 60/39.05 |
| 4,894,986 | 1/1990 | Etheridge | 60/258 |
| 4,910,957 | 3/1990 | Moreno et al. | 60/39.06 |
| 4,912,931 | 4/1990 | Joshi et al. | 60/732 |
| 4,942,732 | 7/1990 | Priceman | 60/261 |
| 4,972,811 | 11/1990 | Baresel et al. | 123/143 B |
| 5,169,515 | 12/1992 | Ngan et al. | 208/48 R |

OTHER PUBLICATIONS

English translation of Laid Open Patent Application JP56–30514 (Laid Open Date: Mar. 27, 1981).

The American Society of Mechanical Engineers, "Deposits from Heated Gas Turbine Fuels", by E.J. Szetela, United Technologies Research Center, East Hartford, CT, pp. 1–5, presented at Gas Turbine and Fluids Engineering Conference, New Orleans, LA, Mar. 21–25, 1976.

Kirk–Othmer, "Encyclopedia of Chemical Technology", vol. 3, 34th Ed. (1979), pp. 328–351 Aviation and Other Gas Turbine Fuel.

Kirk–Othmer, "Encyclopedia of Chemical Technology", vol. 15, 3rd Ed. (1981), pp. 252–269—Metallic Coatings (Survey).

Chemistry of Combustion Reactions, Minkoff et al., pp. 346–347 (1962).

NASA Technical Memorandum 83420, "Research on Aviation Fuel Instability", by Charles E. Baker, David A. Bittker, Stephen M. Cohen and Gary T. Seng, Lewis Research Center, Cleveland, Ohio, prepared for the AGARD Propulsion & Energetics Panel Symposium on Combustion Problems in Turbine Engines, Cesme, Turkey, Oct. 3–7, 1983.

COATED ARTICLE FOR HOT HYDROCARBON FLUID AND METHOD OF PREVENTING FUEL THERMAL DEGRADATION DEPOSITS

CROSS REFERENCE TO RELATED APPLICATIONS

This application is a continuation of application Ser. No. 08/592,248, filed Jan. 26, 1996, now abandoned, which is a continuation of application Ser. No. 08/125,633, filed Sep. 23, 1993, now abandoned, which is a continuation-in-part of application Ser. No. 07/949,593, filed Sep. 22, 1992, now abandoned, which is a continuation-in-part of application Ser. No. 07/673,924, filed Mar. 25, 1991, now abandoned.

BACKGROUND OF THE INVENTION

The present invention relates generally to deposits formed on surfaces in contact with hydrocarbon fluids, and more particularly, to a method of preventing or reducing the deposit of hydrocarbon fluid thermal degradation products on surfaces in contact therewith and to a metal article having a coated surface which inhibits the formation of gum and/or coke formed by thermal degradation of the fluid, without resorting to modification of the fluid, without adoption of special procedures and without installation of special equipment for their use.

As used herein, hydrocarbon fluid is defined as hydrocarbon liquids, hydrocarbon gases or mixtures thereof. As used herein, "hydrocarbon fluid degradation products" includes products which form from the hydrocarbons, for example, certain polymers resulting from thermal transformation of paraffins to cycloparaffins, aromatics and polycyclic molecules in the hydrocarbon, as well as products which result from actual decomposition of the fuel, e.g., carbon.

Because high temperature is usually associated with undesirable levels of hydrocarbon fluid deposit formation, the technical subject herein is customarily referred to as thermal instability, or in the case of fuels, as fuel instability. Flowing hydrocarbon fluids including lubricating oils, hydraulic oils and combustible fuels form gum and coke deposits on the surface of containment walls and other parts which they contact, when the fluid and/or surface are heated.

The mechanisms for formation of deposits from thermal instability have been studied and documented. In the case of fuels, it is generally accepted that there are two distinct mechanisms occurring at two levels of temperature. In the first mechanism, referred to as the coking process, as temperature increases from room temperature, starting at about 300° F. (about 149° C.) there is generally a consistent increase in the rate of formation of coke deposits up to about 1200° F. (about 649° C.) where high levels of hydrocarbon lead to coke formation and eventually limit the usefulness of the fuel. A second lower temperature mechanism starting at about room temperature, generally peaks at about 700° F. (about 370° C.) and involves the formation of gum deposits. This second mechanism is generally better understood than the coking process. It involves oxidation reactions which lead to polymerization which includes the formation of gums. Both coke and gum formation and deposits can occur simultaneously in the mid-temperature region.

Coke formation in hydrocarbons is discussed in U.S. Pat. No. 2,698,512, and heat stability of jet fuel and the consequences of thermal degradation of the fuel are discussed in U.S. Pat. No. 2,959,915, both patents being incorporated herein by reference in their entirety. These patents suggest specific formulations which place limitations on the fuel chemistry and impurities associated with hydrocarbon fuels so that the fuels will be usable at high temperatures without the typical formation of gums and coke.

Gum and coke formation are discussed in U.S. Pat. No. 3,173,247, which is incorporated by reference herein in its entirety. It is indicated therein that at very high flight speeds, heat must be transferred, particularly from the engine, to some part of the flight vehicle or to its load, and although the fuel which is stored on the vehicle, could serve to receive this heat, in practice, such procedure is unfeasible because jet fuels are not stable to the high temperatures which are developed at multi-Mach speeds, instead, they decompose to produce intolerable amounts of insoluble gum or other deposits, for example coke. As with the previously referenced patents, the solution to the problem has been directed toward limitations on fuel chemistry and impurities associated with the fuel.

The chemistry of the hydrocarbon fluid mixture and the chemistry of the containment vessel can have a major influence on deposit mechanisms and deposit rates at temperatures where it is most desirable to use the fluid. Hydrocarbon fluids contain impurities of which sulfur and dissolved oxygen from air, are major constituents. Gums are essentially vinyl polymers formed by reactions between oxygen and olefins in hydrocarbon fluids. Coke can also be in the form of carbon polymers and can have crystalline structures, and deposits formed from decomposition products of hydrocarbon fluids, are often observed to be a mixture of gum, coke, hydrocarbons and other impurities. Gums adhere to surfaces much in the same way as glues, and accordingly, they tend to entrap other solid particles such as coke, solid hydrocarbon impurities (or products), and the like and thereby form deposits on surfaces which they contact. In the lower temperature region where gum formation occurs, oxygen from air dissolved in the liquid is the major adverse ingredient. Boiling amplifies this adversity because of the oxygen concentration effect adjacent to hot walls. If oxygen is absent, gum formation is not likely to occur.

In much of the prior art, the problems associated with gum and coke thermal deposits has predominately dealt with bulk fluid chemistry and reactions which can take place within the fluid. These investigations have involved a wide range of hydrocarbon compositions and the presence of numerous impurities such as sulfur compounds, nitrogen compounds, oxygen and trace metals. It has been observed that deposits attached to containment walls often contain very large quantities of sulfur and nitrogen compounds or intermediates thereof in addition to gums and cokes. Little attention has, however, been given in the prior art to the role of the chemistry and reactions which take place in the vicinity the containment walls and the fluid.

In U.S. Pat. No. 3,157,990, certain phosphate additives are added to the monopropellant wherein the phosphates decompose in the reaction chamber and form a coating, probably a phosphate coating, on the internal generator surfaces, and it is suggested that this coating effectively inhibits carbon decomposition and scaling. In U.S. Pat. No. 3,236,046, which is incorporated by reference herein in its entirety, the interior surfaces of stainless steel gas generators are passivated with sulfurous materials to overcome deposition of coke on the surfaces of the gas generator, and passivation is defined as a pretreatment which substantially reduces initial catalytic coke formation.

In U.S. Pat. No. 4,078,604, which is incorporated by reference herein in its entirety, heat exchangers are characterized by thin-walled corrosion resistant layers of electrodeposited gold or similar corrosion-resistant metals on the walls of the cooling channels within the inner wall, and the cooling channels are covered with the electro-deposited layer of gold in order to make the surfaces corrosion resistant to such storable liquid fuels as fuming nitric acid. In this prior art case, the wall is protected from corrosion by the propellent, but the intent is not to prevent deposit formations.

Protective metal oxide films on metal or alloy substrate surfaces susceptible to coking, corrosion or catalytic activity are referred to in U.S. Pat. No. 4,297,150, which is incorporated by reference herein in its entirety, where it is first necessary to pre-oxidize a substrate surface and then to deposit on the pre-oxidized surface a metal oxide of calcium, magnesium, aluminum, gallium, titanium, zirconium, hafnium, tantalum, niobium or chromium by vapor phase decomposition of a volatile compound of the metal, wherein nitrogen, helium, argon, carbon dioxide, air or steam may be used as carrier gases for the metal compound, the volatile compound having at least one metal-oxygen bond.

In U.S. Pat. No. 4,343,658, reference is made to the protection of metal substrate surfaces against carbon accumulation when exposed to an environment wherein carbon-containing gases are decomposed by the use of tantalum and/or tungsten entities deposited and/or diffused into the surface of the substrate. According to U.S. Pat. No. 4,343,658, which is incorporated by reference herein in its entirety, filamentous carbon grows on surfaces at a reduced rate (by a factor of at least four) when the tantalum and/or tungsten entity deposited on the surface is decomposed at a temperature of 600° C. to 1200° C. to drive tungsten and/or tantalum metal into the substrate surface.

In Japanese patent application No. 57-12829, reference is made to preventing the adhesion of tar by spray coating a blend containing aluminum chloride and cobalt oxide on a surface to provide a coated surface which has a catalytic activity for the decomposition of tar compounds into compounds that can be vaporized at low temperatures. According to Japanese patent application No. 56-30514, when tar collects on a surface which has been spray coated with a blend of a tar decomposing catalyst chosen from titanium oxide, zirconium oxide, vanadium oxide, chromium oxide, molybdenum oxide, tungsten oxide, manganese oxide, iron oxide, cobalt oxide, nickel oxide, copper oxide, platinum, palladium, rhodium, ruthenium osmium or iridium and an inorganic binder of silicate, aluminum phosphate, glass, lithium, silicate solution, colloidal silica or alumina sol, it can be heated at 350° C. for 60 minutes to remove the tar built up on the surface.

Thermal instability and fuel instability, referred to above, are becoming more significant with developing technology, and it will become even more significant as processes and machinery will be required to operate at higher temperatures as afforded by advances in materials technology and as the chemical quality of hydrocarbons for fuels, oils, lubricants, petrochemical processes (plastics and synthetics) and the like, decreases. Furthermore, hydrocarbon fluids, fuels and oils derived from non-petroleum sources, such as shale and coal, will have significantly more problems with thermal instability because of their high content of olefins, sulfur and other compounds. Accordingly, it is advantageous to provide coated articles and processes for preventing the formation of adverse degradation products and foulants in such applications where thermal instability, including fuel instability, is a problem as a result of exposure of such fluids to high temperatures.

In view of the foregoing, it can be seen that it would be desirable to provide coated metal articles, e.g., fuel containment articles for containing hot hydrocarbon fluid, in which or on which degradation products formed by thermal degradation of the hydrocarbon fluid is avoided, eliminated or reduced. It would also be desirable to provide a method of protecting metal surfaces which contact hot hydrocarbon fluid, from the deposit of degradation products of the hydrocarbon fluid. It can also be seen from the foregoing that it is desirable to provide methods and articles for use with hydrocarbon fuels wherein the hydrocarbon fuel can be used as a heat sink without the undesirable deposit of insoluble gums, coke, sulfur compounds or mixtures thereof on surfaces, e.g., containment surfaces. It is also desirable to provide methods and articles for containment of vaporized fuel to reduce $NO_x$ emission and to provide methods and articles for containment of low quality fuels derived from coal, shale and low grade crude oil.

The disadvantages of the prior art processes and techniques discussed above involve the need to alter the hydrocarbon chemistry, maintain strict control of impurities and/or provide additives and special processing such as pre-oxidizing treatment, passivation treatments and/or post-decomposition heat treatments using excessive amounts of heat, and the like. All of these techniques constrain the use of the fluid, increase cost and promote uncertainty as to the quality level of the fuel or treatment at a particular time. Furthermore, there are a multitude of processes, systems and devices including petrochemical processes, machine tools, automobile engines, aircraft gas turbine engines, and marine and industrial engines in which surface deposits from hydrocarbon fluids, fuels and oils are a major problem. Deposits can foul heat exchangers, plug fuel injectors and lubrication distribution jets, jam control valves and cause problems with many other types of operating and control devices associated with hydrocarbon fluids, fuels and oils. It is a primary objective of this invention to overcome these disadvantages.

SUMMARY OF THE INVENTION

These and other disadvantages are overcome in accordance with the present invention by providing a coating, also referred to as a liner, liner material, coating material, catalytic coating material, diffusion barrier or diffusion barrier material on a metal surface, also referred to herein as a substrate, or in certain preferred embodiments, providing a catalytic coating material on a diffusion barrier material which is coated on a metal surface. The present invention overcomes the limitations of the prior art as discussed above by providing a method and coated articles which eliminate or reduce the surface reactions which lead to formation of thermal instability deposits from hydrocarbon fluids and which eliminate or reduce adherence of deposits on surfaces of articles and containers wherein the deposits occur as a result of using ordinary low-cost fuels, oils and other hydrocarbons without focusing special attention to impurities or quality. Thus, coated articles and containers are provided in which the surface reactions which lead to formation of thermal instability deposits from hydrocarbon fluids, have been eliminated.

In accordance with the present invention, there is provided a method and articles for preventing the deposit of degradation products and/or thermal instability deposits from hot hydrocarbon fluids on a metal substrate, and metal surfaces are protected from the deposit of hydrocarbon fluid degradation products resulting from thermal degradation of hot hydrocarbon fluid in a fluid containment article or system carrying hot hydrocarbon fluid. Thus, for example, as a result of the present invention, heat generated by combustion of fuel in the operation of a combustor which utilizes hydrocarbon fuel, or heat from other sources, can be transferred by heat exchange principles to hydrocarbon fuel without the undesirable thermal degradation of the fuel and the subsequent deposit of thermal degradation products on the walls of the articles containing or contacting the fuel.

In one aspect of the present invention, there is provided an article for containing or contacting hot hydrocarbon fluid comprising a substrate having a surface adapted for contact with the hydrocarbon fluid wherein the surface comprises a coating material of a catalytically-active material which catalyzes gum-forming reactions in the hydrocarbon fluid to promote the formation of coke, the coke being substantially non-adherent to the coating material, or, a catalytically-inactive diffusion barrier material which is inert to thermal degradation in the hydrocarbon fluid and inhibits the formation of coke, the catalytically-active and catalytically-inactive materials inhibiting the formation of gum or sulfur compounds or mixtures thereof formed by thermal degradation of the hydrocarbon fluid, the coating material being a physical diffusion barrier located between the substrate and hydrocarbon fluid. In accordance with a preferred embodiment of the present invention, a catalytically-active material is zirconium oxide and a catalytically-inactive material is tantalum oxide deposited or applied by a chemical vapor deposition (CVD) process, e.g., by effusive chemical vapor deposition of an organometallic precursor compound for the particular oxide deposited as the coating material, wherein the applied oxide coating material is sufficient to prevent the formation of deposits of metal sulfides, metal oxides or mixtures thereof, the deposits resulting from the reaction of sulfur, oxygen or mixtures thereof in hydrocarbon fluid with metal atoms which diffuse to the surface.

In another aspect of the present invention, there is provided a method for preventing the deposit on a metal surface of thermal degradation products derived from hydrocarbon fluid by applying a layer of zirconium oxide catalytic coating material on a layer of tantalum oxide diffusion barrier material deposited on a metal surface, the diffusion barrier material and the catalytic coating material having been deposited or applied by a chemical vapor deposition (CVD) process, e.g., by effusive chemical vapor deposition of an organometallic precursor compound on the surface without the use of carrier gas, without pre-oxidation of the surface and without thermal decomposition of the diffusion barrier material.

In one preferred embodiment of the present invention, there is provided a method for preventing the deposit on a metal surface of coke derived from hydrocarbon fluid containing sulfur, oxygen or mixtures thereof, in contact with the metal surface for a sufficient residence time to form coke, wherein the residence time sufficient to form coke is the result of the formation on the metal surface of cavities within the metal sulfides formed from the reaction of sulfur and metal atoms which diffuse to the surface, of metal oxide from the reaction of oxygen and metal atoms which diffuse to the surface, or mixtures thereof comprising, applying to the metal surface a tantalum oxide diffusion barrier material which prevents the formation of metal sulfide, metal oxide or mixtures thereof on the metal surface, the tantalum oxide diffusion barrier material being applied by chemical vapor deposition, e.g., by effusive chemical vapor deposition of an organometallic compound on the surface without the use of carrier gas, without pre-oxidation of the surface and without thermal decomposition of the diffusion barrier material. In this embodiment of the invention, the coating material itself, i.e., the diffusion barrier material, is inert to chemical reaction with hydrocarbons and hydrocarbon impurities, that is, it is inert to the chemical deformation of such thermal degradation products as gum, coke, sulfur compounds and the like in the fluid. As used herein, the coating material in this instance is a catalytically-inactive material.

In another preferred embodiment of the present invention, there is provided a method for preventing the deposit on a metal surface of gum which attaches to irregularities on the metal surface, wherein said gum is derived in the presence of oxygen from thermal reactions of a hydrocarbon fluid containing oxygen in contact with the metal surface comprising, applying to the metal surface a zirconium oxide catalytic coating material which promotes by thermal decomposition in the hydrocarbon fluid the formation of coke while simultaneously inhibiting the formation of gum on the metal surface, the coke being substantially non-adherent to the catalytic coating, the catalytic coating being applied by chemical vapor deposition, e.g., by effusive chemical vapor deposition of an organometallic compound on the surface without the use of carrier gas, without pre-oxidation of the surface and without thermal decomposition of the catalytic coating material. Thus, in this embodiment, the formation of coke, which is substantially non-adherent or loosely-adherent to the coating material, is promoted while the formation of gum is inhibited. In this embodiment of the invention the coating material itself is a catalyst which accelerates or promotes the reaction of hydrocarbon and hydrocarbon impurity to beneficial products (coke) which do not adhere or tend not to adhere to the coating material. The coke and any similar products can be tolerated in fuel because they do not tend to adhere to surfaces, and they burn in the combustor along with the fuel. As used herein, the coating material in this embodiment is a catalytically-active material.

The coating material is deposited as a layer or layers on a surface which is adapted for contact with a hydrocarbon fluid, for example, a distillate fuel, and depending on the particular coating material on the metal substrate, it inhibits or prevents the formation of gum, coke, sulfur compounds or mixtures thereof formed by the thermal decomposition of the hydrocarbon fluid, or it catalyzes the formation of coke while inhibiting or preventing the formation of gum. The coating material is also a physical diffusion barrier to the hot hydrocarbon fluid, that is, it will not permit the diffusion of or passing of the fluid through the material to the substrate on which the coating material is deposited. Thus, the coating material is a physical barrier located between the substrate and the hydrocarbon fluid.

From the foregoing, it is evident that the present invention solves the problems related to the formation of gum, coke, sulfur and other reactions which are chemically associated with contact between hot hydrocarbon fluid and the materials which the fluid contacts, for example, a wall. The present invention also solves the problems associated with the attachment or adherence of deposits to materials which the fluid contacts, by either physical and/or chemical means. In certain embodiments, the present invention also preferentially directs fluid-surface reactions toward deposits which tend not to adhere to materials which the fluid contacts.

Although there is no intention to be bound by any particular theory or explanation of the mechanism(s) by which the present invention inhibits the formation of gum, coke and sulfur compounds which are formed by thermal degradation of hydrocarbon fluid, it is believed that chemical reactions take place between specific atoms and compounds which are part of the substrate chemistry and react under the influence of temperature with hydrocarbons and hydrocarbon impurities such as oxygen and sulfur and their compounds, to form metal-oxygen and metal-sulfur compounds. These metal compounds form deposits and/or precursors to deposits and provide an attachment mechanism between the substrate and other deposits. This theory is supported by the argument that chemical-absorption provides a much stronger surface bond than would simple physical absorption to the surface. In the specific case of gum deposits, it is theorized that metal atoms and metal compounds in the substrate can react to form hydrocarbon radicals which are then highly susceptible to further reaction such as with oxygen, to lead ultimately to polymerization and gums. Substrate reactions can also provide chemistry which is known in the art to be precursors to gums, and after the precursors attach to the substrate, they become the means for which gums and cokes and other deposits can grow by means of chemical or physical means, to consequential proportions.

The prior art, including U.S. Pat. Nos. 4,297,150 and 4,343,658 discussed above, refer to the use of films, including metal oxide films, to inhibit coke formation. Although the purpose of these films is not easily deduced from the prior art, it might be assumed that the theories and reaction mechanisms referred to in the prior art apply in one form or another to the theories and mechanisms of the present invention, there are significant differences and advantages of the present invention over the prior art. As discussed above, like many chemical reactions, coke deposits are believed to be the result of molecular growth, i.e., formation of large molecules containing essentially carbon and hydrogen. In order for such molecular growth to occur, there must be sufficient residence time and availability of reactant species. When hot hydrocarbon fluid containing an impurity, e.g., sulfur, flows over a hot metal or metal alloy surface containing certain metals, e.g., iron, a strong affinity for the formation of iron sulfide causes iron atoms from the metal to diffuse to the surface and react with the sulfur. The iron sulfide formed by this mechanism (iron sulfide being essentially black in color and appearing to be coke) provides the essential means for coke formation. Because the iron sulfide crystals are irregular, the surface is easily wetted by the hydrocarbon fluids, e.g., the hydrocarbon at the surface has long chemical residence time. This, plus the availability of fresh reactants from flowing hydrocarbon contacting the surface causes the formation of coke.

Many coatings and coating materials, including the metal oxide films referred to in the prior art, are too porous to prevent either diffusion of metal atoms, e.g., iron, through the film or coating or to prevent diffusion of the hydrocarbon fluid through the film or coating to the metal substrate. Indeed, the porosity of the film or coatings of the prior art may contribute to the coking problem by trapping the hydrocarbon fluid at high temperature for a finite residence time, i.e., a residence time sufficient to permit formation of coke.

In accordance with the present invention, the tantalum oxide and/or zirconium oxide deposited by certain CVD processes, e.g., by effusive chemical vapor deposition, on the surface are sufficiently non-porous to shield objectionable metal atoms and metal compounds in the substrate or wall from reaction with impurities in the fuel. The same coating material is also sufficiently non-porous to physically prevent or inhibit diffusion of metal atoms and metal compounds into the hydrocarbon fluid. The same coating material is also sufficiently non-porous to prevent or inhibit diffusion of the hydrocarbon fluid and any impurities that it contains, to the substrate. By the CVD processes of the present invention, e.g., the effusive chemical vapor deposition of an organometallic compound on the surface without the use of carrier gas and without thermal decomposition of the coating deposited by the process, a non-porous catalytically-inactive diffusion barrier coating and/or a non-porous catalytically-active coating having a porosity sufficiently low to prevent or inhibit diffusion of metal atoms from the coated substrate therethrough, and having a porosity sufficiently low to prevent or inhibit diffusion of hydrocarbon fluid and any impurities it contains therethrough, is deposited on a metal surface adaptable to contact hydrocarbon fluids, e.g., the coating is on a metal surface of an article so as to contact a hydrocarbon fluid during use of the article.

Thus, in another aspect of the present invention there is provided a diffusion barrier article with a substrate having a non-oxidized surface coated with a smooth, continuous, contiguous catalytically-inactive tantalum oxide diffusion barrier material, catalytically-active zirconium oxide diffusion barrier material or catalytically-active zirconium oxide diffusion barrier material on a catalytically-inactive tantalum oxide diffusion barrier material of non-porous, atomically tight, dense, thermally stable zirconium oxide and/or tantalum oxide said catalytically-inactive or catalytically-active barrier being adapted to contact a fluid, i.e., the barrier material is on a surface of the article so as to contact a hydrocarbon fluid during use.

Two types of coating materials may be used in the processes and articles of the present invention. A first type of coating material is a diffusion barrier material which is a catalytically-inactive material. A catalytically-inactive material is one which is inert to the formation of any degradation products in hot hydrocarbon fluid which contacts it. Thus, when such a catalytically-inactive material is used as the liner (diffusion barrier material) on an article adapted to contact hydrocarbon fluid, there is substantially no catalytically-promoted thermal decomposition of the hydrocarbon fluid at elevated temperatures, for example, up to 900° F., and there is no sulfur compound or coke in the heated fluid as a result of activity of the diffusion barrier material on the hot hydrocarbons.

A second type of coating material is a catalytically-active material. A catalytically-active material is one which actively permits or promotes the formation in hot hydrocarbon fluids of a compound or compounds which have no adverse effect on the utilization of the fuel, on the flow and transport of the fuel and/or on the components contacted by the fuel. More specifically, a catalytically-active material is one which actively permits or promotes the formation of coke in the hot hydrocarbon fluid, a coke which remains substantially dispersed in the fluid as it flows and is transported through containment articles and/or contacts other components and is ultimately burned, or otherwise utilized, with the fluid. Coke which is so formed and remains substantially dispersed in the fluid in which it is formed, is defined herein as loosely-adhered or substantially non-adherent coke because it tends not to stick or to adhere to containment walls and elements either by physical or chemical attraction. With the formation of coke in the presence of the catalytically-active material is the simultaneous inhibition or repression of formation of gum.

BRIEF DESCRIPTION OF THE DRAWINGS

These and various other features and advantages of the invention can be best understood from the following description taken in conjunction with the accompanying drawings in which.

DETAILED DESCRIPTION OF THE INVENTION

The terms hydrocarbon fluid, hydrocarbon fuel and distillate fuel may be used interchangeably herein.

The invention has applicability to any hydrocarbon fluid or fuel in which gum, coke and/or sulfur compounds form when the fluid is exposed to heat. Although the invention is not directed to or limited by any particular hydrocarbon fluid or hydrocarbon fuel, typical fuels for which the method and fluid containment and other articles of the present invention are adapted, and typical fuels from which the substrates of fluid containment articles are protected in accordance with the present invention, are the combustible hydrocarbon gases, such as natural gas, and the hydrocarbon or distillate fuels generally discussed above and include hydrocarbons and distillation products thereof which are generally liquid at room temperature. The fluids may be mixtures of hydrocarbons, mixtures of such distillation products, mixtures of hydrocarbons and distillation products, gasoline, No. 1 or No. 2 diesel fuels, jet engine fuels, such as Jet-A fuel, or the foregoing fuels mixed with additives which are well-known in the art. Hydrocarbon fuels refer to the liquid fuels which are conventionally used in reaction motors, including but not limited to, industrial gas turbines, engines used in internal combustion engines, including but not limited to automobile and truck engines, jet propelled aircraft or any other gas turbine engine, all of which are conventionally known in the art and, for example, certain of the aviation and other gas turbine fuels discussed in volume 3, third edition, *ENCYCLOPEDIA OF CHEMICAL TECHNOLOGY,* pages 328–351 (1979). Various hydrocarbon fuels which are particularly desirable for jet aircraft engines, are also described at column 6, lines 30–74 of U.S. Pat. No. 2,782,592 and at column 2, lines 28 to column 3, line 23 of U.S. Pat. No. 2,959,915 both of which are incorporated by reference herein in their entirety.

Although all of the foregoing hydrocarbon fluids can be used in the present invention, and the advantages of the present invention apply thereto, it is an unexpected advantage of the present invention that conventional, untreated, low-cost hydrocarbon fluids can be used as fuel in jet engines without special handling, without further treatment, without costly quality control procedures, and without the need for special processing either prior to or subsequent to loading the fuel in the aircraft. Furthermore, these same advantages apply to all other processes and systems which utilize hydrocarbon fluids including but not limited to, the petrochemical and plastics industries, the synthetic fuels industry, commercial and home heating industries and the like.

The articles of the present invention may be any component which is adapted to contact or contain hot hydrocarbon fluid, for example, liquid hydrocarbon jet engine or diesel fuel, heated at a temperature at which degradation products form in hydrocarbons, hydrocarbons circulating in conduits, heat exchangers and the like, of refineries, polymer plants and power plants, furnaces and the like. Such articles for containing hot hydrocarbon fluid are defined herein as fluid containment articles. Examples of such fluid containment articles are discussed above and include any device in which hot hydrocarbon fluid can be confined, stored, transported or otherwise subjected to heat exchange without ignition or combustion of the hot fluid. The present invention is particularly adaptable to heat transfer surfaces where heat is transferred from a combustor or other heat source through a wall to liquid hydrocarbon fluid. Specific examples of articles for containing or contacting hot hydrocarbon fluids in accordance with the present invention include fuel storage tanks, conduits for transporting liquid fuel, coils and other devices for heat exchange contact with fuel, fuel injector surfaces, nozzles and the like.

Other articles which may be coated by the process and with the special CVD coating materials of the present invention, e.g., effusive CVD coating materials of metal oxides, e.g., tantalum and/or zirconium oxides, include automobile and truck engine parts which are exposed to hot hydrocarbon fuel, e.g., gasoline, natural gas, diesel fuel and the like, including parts of engines in which air and fuel are mixed and/or atomized and/or vaporized. These parts include valves, cylinders, fuel injectors, fuel atomizers, combustion chambers and the like. The present invention also may be used in conjunction with manufacturing and other processes where fuel injectors, nozzles, valves and the like which may come in contact with hot fuels, are coated with the coating materials by the process of the present invention.

Figure 1:
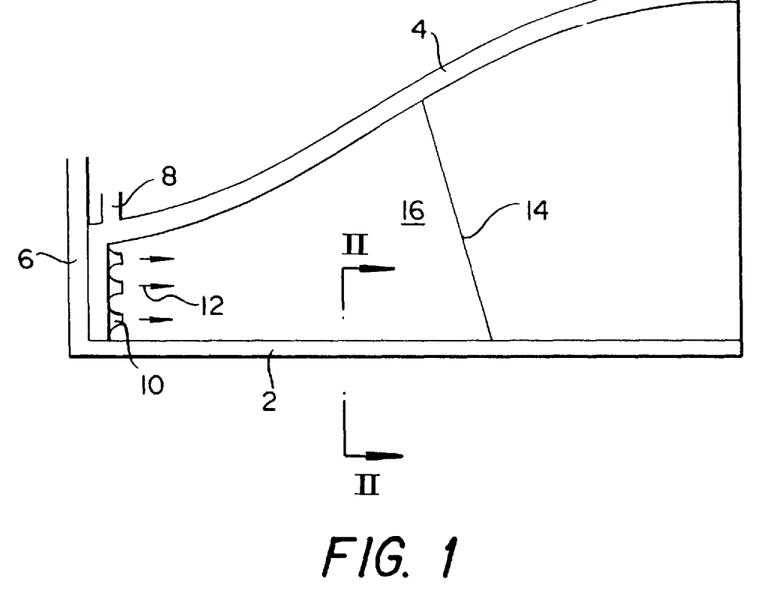
FIG. 1 is a partial longitudinal view of a high pressure turbine nozzle for a jet engine fueled by distillate fuel and incorporating the heat exchanger wall construction of the present invention.

One fluid containment article is shown in FIG. 1 which represents a heat exchanger for cooling the high pressure turbine nozzle of a jet engine by transferring the heat generated therein to liquid hydrocarbon fuel confined in and transported through conduits or chambers adjacent the nozzle wall.

In FIG. 1, liquid hydrocarbon fuel enters the high pressure turbine nozzle at conduit 6 and passes through heat exchanger 2 where heat from combustion chamber 16, for example, operating at a temperature such that the walls of the nozzle which form chamber 16 have a temperature of about 1200° F. (about 649° C.), is cooled by the liquid hydrocarbon fuel passing through fuel passageway 2. Thus, there is heat exchange between the walls of chamber 16 and the liquid hydrocarbon fuel passing through passageway 2. Hydrocarbon fuel also passes through passageway 4 where heat exchange also occurs between the wall of the chamber 16 and the hydrocarbon fuel in passageway 4. Heated and vaporized hydrocarbon fuel 12 flows into chamber 16 through gas injection ports 10.

Figure 2:
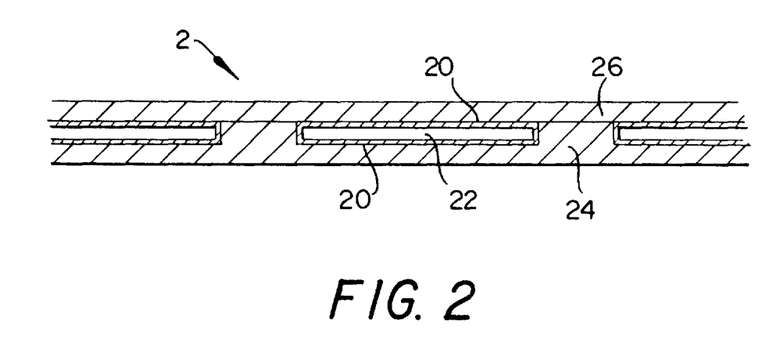
FIG. 2 is a sectional view taken along the line of II—II of FIG. 1 showing fuel containment passages for circulating distillate fuel.

Referring to FIG. 2 which shows in more detail the fuel containment passageway of FIG. 1, FIG. 2 being taken along the lines II—II of FIG. 1, hydrocarbon fuel passageway 2 contains walls 24 and 26 through which fuel passageway 22 is formed. Catalytic coating material 20 or diffusion barrier material 20 or catalytic coating material coated on diffusion barrier material 20 of the present invention are coated by the CVD processes according to the present invention, i.e., by an effusive chemical vapor deposition process without the use of carrier gas, without pre-oxidation of the metal surface and at low temperatures, i.e., at temperatures of about 400° C. to about 460° C. for tantalum oxide and at temperatures of about 350° C. to about 425° C. for zirconium oxide, e.g., temperatures which will not thermally decompose the material, on substrates 24 and 26 so that they form a coating over the metal surfaces of passageway 22. Thus, numeral 20 in FIG. 2 represents the diffusion barrier material or catalytic coating material or a combination thereof applied by the CVD processes according to the present invention, i.e., by an effusive CVD process without carrier gas, without pre-oxidation of the metal surfaces and without thermal decomposition of the zirconium oxide catalytically-active coating and/or the titanium oxide catalytically-inactive barrier material in accordance with the present invention.

Substrates 24 and 26 of FIG. 2, which represent the heat exchanger walls of chamber 16 in the high pressure turbine nozzle of FIG. 1, are generally constructed of any conventional material as well-known in the art. For example, such substrates may be stainless, steel, corrosion-resistant alloys of nickel and chromium, high-strength, corrosion-resistant nickel-base alloys, and the like. It is these typical substrate materials which appear to cause or promote the formation of fuel thermal degradation products, such as gum, coke and/or sulfur compounds or mixtures thereof, in hydrocarbon fluids and fuels. It is the surface of substrates 26 and 24 which are adapted for contact with the hydrocarbon fuel by the formation of passageways, for example, as shown by numeral 22 in FIG. 2, therein.

Hydrocarbon fuel can be transported through passageway 22 by any appropriate means (not shown), and the hydrocarbon fuel as it passes through passageway 22 contacts the substrate. However, in accordance with the present invention, passageway 22 is actually formed from diffusion barrier material 20, catalytically-inactive coating material 20 or a combination of catalytically-inactive coating material on diffusion barrier material 20 which has been coated by the CVD processes according to the present invention, e.g., by an effusive CVD process without the use of carrier gas, without pre-oxidation of the metal surface and preferably at low temperatures, i.e., at temperatures of about 400° C. to about 460° C. for tantalum oxide and at temperatures of about 350° C. to about 425° C. for zirconium oxide, e.g., at temperatures which will not cause decomposition of the coated material, upon the metal surfaces of substrates 24 and 26 which form passageway 22. Accordingly, as the hydrocarbon passes through passageway 22, it actually contacts the effusive CVD deposited coating material 20. For best results, the layer or layers of coating material 20 are continuous and completely cover all surfaces of passageway 22 which are formed from substrates 24 and 26 and which provide a heat exchange relationship because of its contact with the hydrocarbon fuel. In certain embodiments in accordance with the present invention, when coating material 20 is a catalytic coating material, it does not have to form a diffusion barrier between metal atoms in the substrate and impurities in the fuel.

In accordance with the present invention, the layer or layers of diffusion barrier material 20 which actually form passageway 22 by virtue of the continuous coating of the applied diffusion barrier material 20 on the surfaces of the passageway formed by substrates 24 and 26, are a diffusion barrier material which is catalytically-inactive and inhibits or prevents formation of coke, and is, for example, amorphous tantalum oxide deposited by the CVD processes according to the present invention, e.g., an effusive CVD process, or it is a catalytic coating material which is catalytically-active and catalyzes the thermal decomposition in the fuel to promote the formation of a loosely-adherent coke in the fluid, and is, for example, zirconium oxide deposited by the CVD processes according to the present invention, e.g., an effusive CVD process, or it is a combination of layers of both diffusion barrier and catalytic coating material. The effusive CVD-applied diffusion barrier material or effusive CVD-applied catalytic coating material is sufficient to prevent the formation of deposits resulting from sulfur, oxygen and mixtures thereof in hydrocarbon fuel with metal atoms at the surface of the passageway, i.e., wherein the barrier is a smooth, continuous and contiguous material of non-porous, atomically tight, dense, thermally stable tantalum oxide, zirconium oxide or zirconium oxide on tantalum oxide.

In certain preferred embodiments, material 20 is also a physical diffusion barrier to the hydrocarbon fuel and prevents contact between the fuel and the metal substrate, or more specifically, between the fuel and certain metal atoms which normally migrate from the metal substrate when it is contacted with the fuel. Thus, material 20 which coats substrates 24 and 26 and thereby forms passageway 22, is an inert or catalytically-inactive material which prevents, reduces or inhibits the formation of coke and/or sulfur compounds, and thereby prevents, reduces or inhibits the deposit of coke and/or sulfur compounds on the surfaces of the passageway, or a catalytically-active material which catalyzes thermal decomposition in the fuel to promote the formation of a loosely-adherent or substantially non-adherent coke while simultaneously inhibiting the formation of gum and thereby prevents, reduces or inhibits the deposit of gum on the surfaces of the passageway, and promotes the formation of coke, the coke remaining suspended or dispersed in the fuel wherein it is transported with the fuel to the combustor for burning.

As explained above, hydrocarbon fluids containing sulfur or oxygen react with metal atoms in a metal surface to form metal sulfide or metal oxides. These sulfides or oxides bond chemically to the surface providing a microscopically coarse, textured surface. Hydrocarbon fluid then fills the vacancies or irregularities in this textured surface where it stagnates and provides sufficient residence time required to form coke. The coke reaction is usually exothermic causing additional self-heating. As the coke molecules grow, they lock themselves within the micro-cavities or irregularities of the sulfide or oxide coated surface layer. Once anchored to the surface, the coke continues to grow by its own coarse nature, trapping additional coke-forming reactants.

In order to prevent coke formation, the present invention provides a coating which prevents metal-sulfur and/or metal-oxygen reactions. This is achieved in preferred embodiments by coating the metal surface with a thin atomically tight metal oxide coating, i.e., non-porous to the diffusion of metal atoms, e.g., iron, chromium and the like, through the coating and non-porous to the diffusion of hydrocarbon fluid and impurities therein through the coating, e.g., in preferred embodiments by coating the metal surface with a thin, atomically tight tantalum oxide coating. In accordance with the present invention, it has been found that the metal oxide coating, defined herein as diffusion barrier material, must be formed on metal substrates by those CVD processes which form a coating on a metal surface wherein the coating is of a porosity sufficiently low to prevent or inhibit the diffusion of metal (metal atoms) from the metal-surface on which it is coated through the coating, i.e., atomically tight, and is of a porosity sufficiently low to prevent the diffusion of hydrocarbon fluid and impurities therein through the coating, i.e., non-porous. An example of such a CVD process is the effusive chemical vapor deposition of an organometallic compound without the use of a carrier gas, without pre-oxidation of the metal substrate and at temperatures which do not decompose the metal oxide applied on the metal substrate. The coating is essentially a diffusion barrier between metal atoms in the surface and sulfur and/or oxygen in the hydrocarbon fluid.

The quality of the coating with respect to diffusion must be such that metal atoms, such as, iron, nickel and chromium, cannot diffuse through the surface and contact sulfur or oxygen in the fuel. Furthermore, the coating itself must have a surface with no vacancies or irregularities which will provide areas of stagnation when flowing hydrocarbon fluids contact the surface, thereby increasing the residence time of the fluid to the extent that coke will form therein and continue to grow and accumulate therein. Consequently, the coating deposited by the effusive CVD process in accordance with the present invention must be smooth.

The tantalum and zirconium oxides which can be used as coatings on the surface of metal substrates in accordance with the present invention are those which can be deposited by the CVD processes according to the present invention, e.g., by effusive chemical vapor deposition without use of carrier gas and without thermal decomposition of the diffusion barrier material to form uniformly thin, e.g., about 0.1 to 5.0 microns in thickness, coatings which inhibit or prevent metal diffusion therethrough at temperatures up to about 1000° F. (about 538° F.) or higher. The oxide coatings which are useful in the present invention, must also be thermally stable, i.e., they must not decompose or melt at operating temperatures, e.g., about 500°–1200° F. (about 260°–649° C.). The oxides deposited in accordance with the present invention must be inert toward the metal substrate to which they are applied, i.e., they must be non-reactive with the metal in the metal substrate.

In accordance with the present invention, the preferred tantalum and zirconium oxides which prevent diffusion of metals in the metal wall into the hydrocarbon fluid where they cause reactions between impurities in the hydrocarbon fluid and metals from the wall must be contiguous, dense and "atomically tight" enough to prevent significant metal diffusion at temperatures up to about 1000° F. (about 538° C.) or higher; thermally stable up to high temperatures, e.g., about 500°–1200° F. (about 260°–649° C.); and non-reactive with the metal wall. By use of the term "dense" herein, is meant 98% and greater of the bulk density, i.e., non-porous.

The present invention is not limited to any particular organometallic compound for use in the CVD processes according to the present invention, e.g., the effusive CVD process. Any organometallic precursor compound which results in the deposit by the CVD processes according to the present invention, e.g., by the effusive CVD process, of the metal oxide coating sufficient to form a diffusion barrier between metal atoms in the surface of the substrate and sulfur and/or oxygen in the hydrocarbon fluid and thereby prevents the formation of metal sulfide and/or metal oxide deposits from the fuel-metal substrate interaction so that there is insufficient residence time for the formation of coke in irregularities and vacancies formed in such metal sulfide and/or metal oxide deposits, may be used in accordance with the present invention.

In accordance with the present invention, a preferred organometallic compound is tantalum ethoxide and the diffusion barrier material deposited by the effusive CVD process is tantalum oxide ($Ta_2O_5$), more preferably, amorphous tantalum oxide.

In accordance with the present invention, the effusive chemical vapor deposition must be carried out at a temperature at which the deposited metal oxide, e.g., amorphous tantalum oxide or zirconium oxide, does not decompose, i.e., convert to the metallic or some other form. In order to prevent such decomposition, the effusive CVD process is carried out at temperatures of about 400° C. to about 460° C. for tantalum oxide and at temperatures of about 350° C. to about 425° C. for zirconium oxide. In accordance with the present invention, heat may be applied as well known in the art by conventional means, e.g., an oven or vacuum furnace, and/or the article being coated may be heated by induction heating and the like. Although the pressure at which the effusive chemical vapor deposition is carried out is not critical, in preferred embodiments, the pressure is about 50 milliTorr to about 500 milliTorr.

In accordance with certain aspects of the present invention, it has been found that low temperature CVD processes, e.g., low temperature effusive CVD processes, provide superior diffusion barrier articles. When low temperature CVD processes are used, the applied coatings, i.e., the metal oxide, require no annealing, and, in accordance with the present invention, annealing is excluded from the process. As used herein, low temperature CVD process, e.g., low temperature effusive CVD process, is defined as a CVD process which is carried out at a temperature of about 400° C. to about 460° C. for tantalum oxide and preferably at a temperature of about 410° C. to about 430° C. for tantalum oxide and at a temperature of about 350° C. to about 425° C. for zirconium oxide and preferably at a temperature of about 375° C. to about 390° C. for zirconium oxide, i.e., the temperature at which the precursor gas is heated and/or the temperature at which the heated gas is applied on the substrate being coated. Optimum low temperatures vary depending upon the particular compound utilized as the precursor for the coating material. In certain embodiments, zirconia has been applied at a temperature of about 380° C.; and tantala has been applied at a temperature of about 420° C. in accordance with the present invention. By the process of the present invention, the low temperature CVD, e.g., the low temperature effusive CVD process results in the homogeneous application of the metal oxide.

Silica and other oxides are discussed and claimed as coating materials in a copending U.S. patent application entitled "Coated Articles and Method for the Prevention of Fuel Thermal Degradation Deposits" filed by George A. Coffinberry and John Ackerman, application Ser. No. 08/816,129, filed Mar. 12, 1997, incorporated by reference herein.

In accordance with other aspects of the present invention, the metal of the metal substrate having a surface which is coated in accordance with the process of the present invention, may be simultaneously tempered during the effusive chemical vapor deposition process. The temperatures at which effusive CVD is carried out in accordance with the present invention, are sufficient to heat the metal in the metal substrate at temperatures which temper the metal. When heat treatable steel is used, it may be desirable to temper the steel to improve the properties of the substrate, e.g., to improve homogeneity and the like as well known in the art.

Tempering modifies the properties of various steels, e.g., quench-hardened steels, to produce a more desirable combination of strength, hardness and toughness than obtained in the quenched steel. More than one tempering cycle may be necessary to produce an optimum structure using temperatures well known in the art. For example, in certain cases this can be better accomplished by two or more shorter tempering cycles than by a single and longer cycle as explained in Metals Handbook, 8th edition, volume 2, pp. 223–224 where recommended temperatures and approximate heating times are shown for tempering certain steels. In accordance with the present invention, the final tempering cycle of the metal substrate can occur simultaneously with the application of tantalum oxide and/or zirconium oxide.

As used herein, effusive CVD, i.e., effusive chemical vapor deposition, or any CVD process which deposits a smooth, continuous, contiguous, dense, atomically tight, non-porous, thermally stable coating according to the present invention, is the vapor deposition of a metal oxide on a surface, the metal oxide being derived from an organometallic compound, preferably a gaseous organometallic compound, at temperatures of about 400° C. to about 460° C. for tantalum oxide, and at temperatures of about 350° C. to about 425° C. for zirconium oxide, preferably at pressures less than atmospheric, e.g., at about 50 milliTorr to about 500 milliTorr, without the use of a carrier gas.

In accordance with the present invention, when a CVD process according to the invention, e.g., the effusive CVD process, is used to deposit coatings on a surface, the surface must not be pre-oxidized. Pre-oxidation or any oxidation of a surface results in the formation of surface irregularities and/or roughness and reduces adhesion of the CVD coating material towards the substrate which is detrimental to the methods of the present invention. For example, as explained above, vacancies or irregularities, such as those caused by oxidation or pre-oxidation of the surface, increase residence time and promote the formation and accumulation of coke.

The coatings of the present invention are applied to the metal of the metal substrate, and accordingly, in preferred embodiments, the metal surface is a clean metal surface from which grease, grime, dirt and the like have been removed. Any conventional cleaning method or cleaning agent may be used to clean the metal surface as long as it does not roughen, deform or cause surface irregularities or vacancies which increase the residence time of flowing fluid in contact therewith. In certain preferred embodiments, the cleaning agent is a conventional organic solvent, e.g., liquid hydrocarbons. One class of liquid hydrocarbons typically used to clean surfaces is the mono- and dialkyl-ethers of ethylene glycol and their derivatives. Any cleaning method or agent used in accordance with the present invention must not cause oxidation of (or the formation of oxides on) the metal surface. Such oxides cause surface irregularities and vacancies and interfere with the effectiveness of the coatings, e.g., the metal oxide coatings applied by effusive CVD process in accordance with the present invention. As used herein, the coatings applied by the present invention are applied coatings which are distinguished from formed coatings which are the result of chemical reaction between the metal atoms in the substrate and various metals in the hydrocarbon fuels, e.g., oxygen and sulfur. Thus, the metal oxide applied by the effusive CVD process of the present invention is an applied metal oxide, and a metal oxide resulting from the reaction between oxygen in the fuel and metal atoms in the substrate is a formed metal oxide.

Furthermore, the CVD processes according to the invention, e.g., the effusive CVD process must be carried out at temperatures which do not decompose the catalytic coating material or the diffusion barrier material or both. As used herein, any temperature which converts or transforms or otherwise causes a reaction in or of the deposited catalytic material or the deposited diffusion barrier material to another form, or otherwise causes a reaction in or a reaction of the deposited materials, is a temperature which decomposes the deposited material. For example, when the deposited material is a metal oxide and the temperature is reached at which metal in the metal oxide is converted to the metallic form, it is defined herein as thermal decomposition of the metal oxide. Accordingly, the CVD processes according to the present invention, e.g., the effusive CVD processes, are carried out at temperatures of about 400° C. to about 460° C. for tantalum oxide and at temperatures of about 350° C. to about 425° C. for zirconium oxide, to avoid thermal decomposition of the deposited diffusion barrier material or catalytic barrier material. At these temperatures, the integrity and effectiveness of the coating material are maintained and decomposition of the coatings is avoided.

The length of time required to carry out the CVD processes according to the invention, e.g., the effusive CVD process, is not critical, the length of time of exposure of the metal substrate to the organometallic compound being dependent on the thickness of the coating desired on the surface of the substrate. It is only necessary to treat the surface of the metal substrate by the effusive or other CVD process until the desired thickness of the layer or layers of coating material is achieved, and one skilled in the art can determine the length of time required to achieve the desired thickness of coating material without undue experimentation by subjecting the surface of the metal substrate to the organometallic compound at a designated temperature and pressure until the desired thickness of the coating is achieved, e.g., until the thickness of the deposited metal oxide is about 0.4 micron.

In certain preferred embodiments, the metal oxide is amorphous so as to be homogeneous and closely packed (dense or atomically tight) in order to prevent diffusion and contact between the fluid and metal atoms in the metal substrate, especially in the case of the diffusion barrier material. Non-amorphous or crystalline metal oxides can also be deposited on substrates in accordance with the present invention as long as such deposits or coatings form a continuous, closely packed (dense or atomically tight) coating and prevent diffusion and contact between the fluid and metal atoms in the metal substrate.

As explained above, gum deposits are eliminated by catalytically redirecting the gum straight-chain polymer growth toward short highly-branched molecules in the nature of coke. In the absence of metal sulfides and in the absence of a sufficient amount of residence time, the coke does not form.

In accordance with the present invention, zirconium oxide is applied to a metal surface to form a catalytic coating material which promotes by thermal degradation in the hydrocarbon fluid the formation of coke while simultaneously inhibiting the formation of gum on the metal surface, the coke being substantially non-adherent to the catalytic coating. The catalytic coating is preferably applied by effusive chemical vapor deposition of an organometallic compound on the surface without the use of carrier gas, without pre-oxidation of the surface and without thermal decomposition of the catalytic coating material as described and defined above.

When the catalytic coating material applied to the metal surface is zirconium oxide the preferred organometallic compound used in the effusive CVD process is zirconium di-isopropoxide diacetylacetonate, $Zr(OC_3H_7)_2(C_5H_7O_2)_2$. In preferred embodiments, the temperature and pressure are the same as those described above. Although the preferred organometallic compound used in the effusive CVD process to deposit the catalytic zirconium oxide on the metal surface is zirconium di-isopropoxide diacetylacetonate, the present invention is not limited to any particular organometallic compound. Any organometallic compound which results in the deposit of a catalytic coating sufficient to promote by thermal degradation in the hydrocarbon fluid the formation of coke while simultaneously inhibiting the formation of gum on the metal surface (or the surface on which it is deposited), may be used in accordance with the present invention.

In another preferred embodiment of the present invention, there is provided a method of applying on a diffusion barrier material coated on a metal substrate by the effusive CVD process described above, a catalytic coating material which promotes by thermal decomposition in the hydrocarbon fluid the formation of coke while simultaneously inhibiting the formation of gum on the diffusion barrier material, the coke being substantially non-adherent to the catalytic coating, the catalytic coating being applied by effusive chemical vapor deposition of an organometallic compound on the diffusion barrier material without the use of carrier gas, without pre-oxidation of the surface and without thermal decomposition of the catalytic coating material, whereby the formation of gum derived from thermal reactions of hydrocarbon fluid containing oxygen in contact with a metal surface and which adheres to irregularities on the metal surface, is prevented. The preferred conditions for the deposit of this catalytic coating material by the effusive CVD process are the same as those described above for the deposit of the diffusion barrier material. In one preferred embodiment in this aspect of the invention, the catalytic coating material applied on an amorphous tantalum oxide diffusion barrier material is a metal oxide, more preferably, zirconium oxide, and the organometallic compound used to apply the catalytic coating on the amorphous tantalum oxide diffusion barrier material in accordance with the effusive CVD process of the present invention, is zirconium di-isopropoxide diacetylacetonate and the catalytic coating material is zirconium oxide.

Although the present invention has utility in any fuel containment article or in any fuel containment system in which fuel does not undergo combustion, and it is particularly useful in forming a diffusion barrier or a catalytic coating in fuel containment articles and fuel containment systems wherein the fuel is used as a heat exchange medium to remove heat from various systems in gas turbines, both industrial and those used in aircraft and the like, it is particularly useful in the heat exchanger surfaces in fuel systems of a gas turbine, a scramjet engine, a ramjet engine, or a turbojet engine or as a conduit for transporting heated hydrocarbon fuel in a fuel system of any of the foregoing.

Unlike the prior art processes and fluid containment articles and systems, the processes and fluid containment articles of the present invention can use conventional low-cost fluids without any disadvantage. The prior art processes and fluid containment articles must use fuels containing additives, special fuel processing procedures and/or special handling, all of which are costly, create additional problems and generate or promote the generation of $NO_x$. With the processes and articles of the present invention, there is a substantially improved system in which $NO_x$ generation can be minimized.

Application of the benefits to be derived from the present invention are quite extensive. One application of these benefits is to provide a heat exchanger surface which can be used to gasify jet fuel without fouling of the heat exchanger surface. The gaseous fuel can then be injected into a gas turbine combustor in a uniform fashion rapidly mixing with air so as to burn at a uniform temperature. Such uniform temperature combustion would substantially reduce the formation of nitrogen oxide pollutants. Another application would also involve heating the jet fuel to a very high temperature during use as a capacious heat sink for cooling various engine and aircraft parts and systems, such as the air used for cooling the engine turbine blades, discs and vanes. Another application would involve coating parts such as fuel nozzles, injectors, and flow distribution jets so as to avoid deposit buildup which would plug the nozzles, injectors and jets. Another application would involve coating of valves so as to avoid sticking and seizing from gums or cokes. These and other applications and benefits of the present invention will become obvious to those skilled in the art based on the teachings of the present invention.

The following specific example describes the methods and articles of this invention. It is intended for illustrative purposes only and should not be construed as limiting the present invention.

A stainless steel planchette or coupon measuring 50 mm long by 8 mm wide by 2 mm thick made from 304 stainless steel was coated with a 0.4 micron thick layer of tantalum oxide, $Ta_2O_5$, by an effusive chemical vapor deposition process. The planchette was cleaned with a non-oxidizing cleaning agent to remove grease, and placed in a heated vacuum furnace maintained at a pressure between about 50 milliTorr to about 500 milliTorr. Heat was applied at a temperature of about 400° C.–450° C. to an organometallic precursor, tantalum ethoxide dimer $(Ta_2(OC_2H_5)_{10})$ in the furnace. The tantalum ethoxide dimer flowed over the substrate and deposited $Ta_2O_5$ onto the substrate surface. No carrier gas was used. This resulted in about a 0.4 micron thickness of atomically tight amorphous $Ta_2O_5$ coating deposited on the planchette.

The test was conducted by flowing commercial grade Jet-A kerosene aviation fuel over planchette for 8 hours at 970° F. and 420 p.s.i.a. A total of 0.74 pounds of hot (970° F.) fuel was passed over the planchette during the 8-hour test. No attempt was made to remove air from the fuel.

Figure 3:
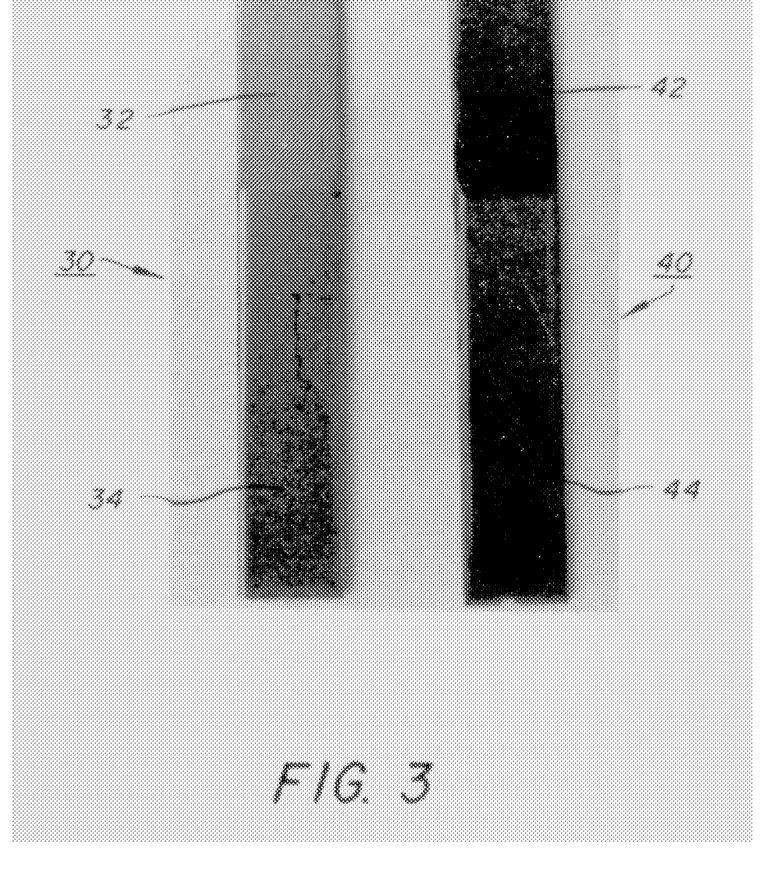
FIG. 3 is a photograph of two (2) stainless steel planchettes showing before and after exposures to hot jet-A fuel.

In FIG. 3, planchette 30 was photographed prior to exposure to coking conditions, that is, prior to the test set forth above. On planchette 30, lower portions or section 34 was coated and remained coated with the tantalum oxide, and upper portion or section 32 was sand blasted to remove the coating of tantalum oxide. Planchette 30 was exposed to the test conditions specified above, and after exposure to the flowing, hot Jet-A fuel, the planchette was removed and photographed and is shown as planchette 40 in FIG. 3.

Comparison of planchettes 30 and 40 shows that a deposit formed on uncoated (upper) portion 42 of planchette 40.

After examination of coated region 44 and uncoated region 42 of planchette 40, the deposit on region 42 was removed by burning in oxygen to form carbon dioxide and sulfur dioxide. The total amount of deposit was determined to be 0.2 mg which corresponds to a deposit rate of 3.1 micrograms/hr/cm$^2$ for the 8-hour test. Based on prior tests of uncoated samples, it is judged that the deposit rate is highest during initial exposure (up to 100 micrograms/hr/cm$^2$ for a 0.5 hour duration test), and that the weight ratio of carbon to sulfur composition of the deposit is about 2 to 1.

Figure 4:
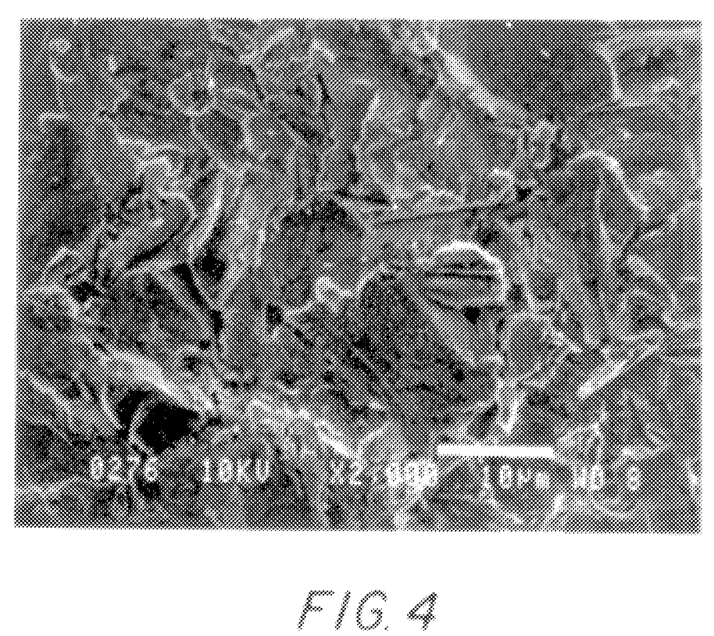
FIG. 4 is a scanning electron beam photomicrograph (magnified 2000x) of an uncoated area (prior to testing) of a planchette which has been sand blasted.
Figure 5:
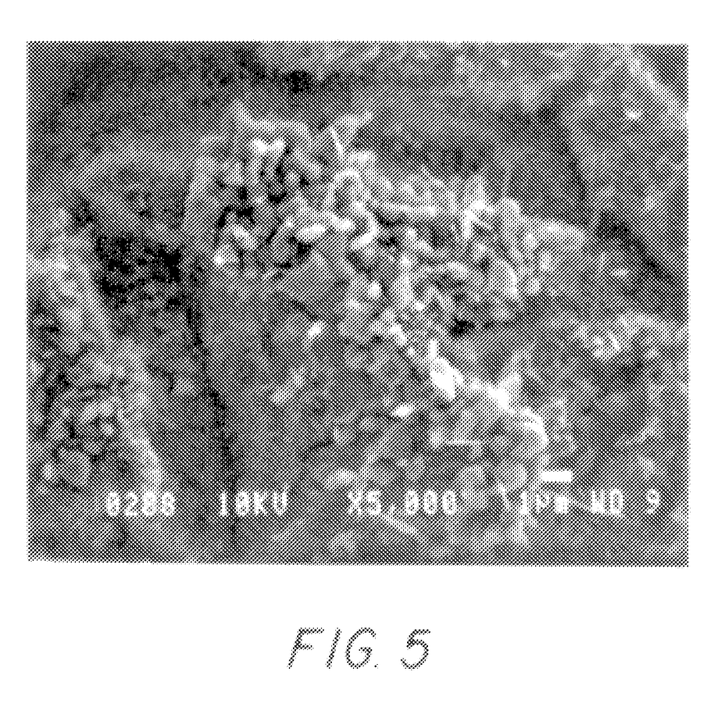
FIG. 5 is a scanning electron beam photomicrograph (magnified 5000x) of an uncoated area (after testing) of a planchette.

FIG. 4 shows uncoated (sand blasted) region 32 of planchette 30 before the test. FIG. 5 shows the deposit formed on uncoated region 42 of planchette 40 after the test. The rock-shaped crystalline deposit shown in FIG. 5 was found to contain up to 30–40% sulfur. As the sulfur concentration in the Jet-A fuel is only about 200 ppm, this represents a high concentration in the deposit. These same crystals were determined by x-ray diffraction to be chromium sulfide, indicating that the sulfur impurities in the fuel reacted with chromium in the 304 stainless steel. No chromium could be found in the Jet-A fuel feed, hence the chromium had to come from the steel. The black appearance of the deposit is characteristic of either carbon or chromium sulfide, leading to the speculation that chromium sulfide could easily be misinterpreted as coke.

Figure 6:
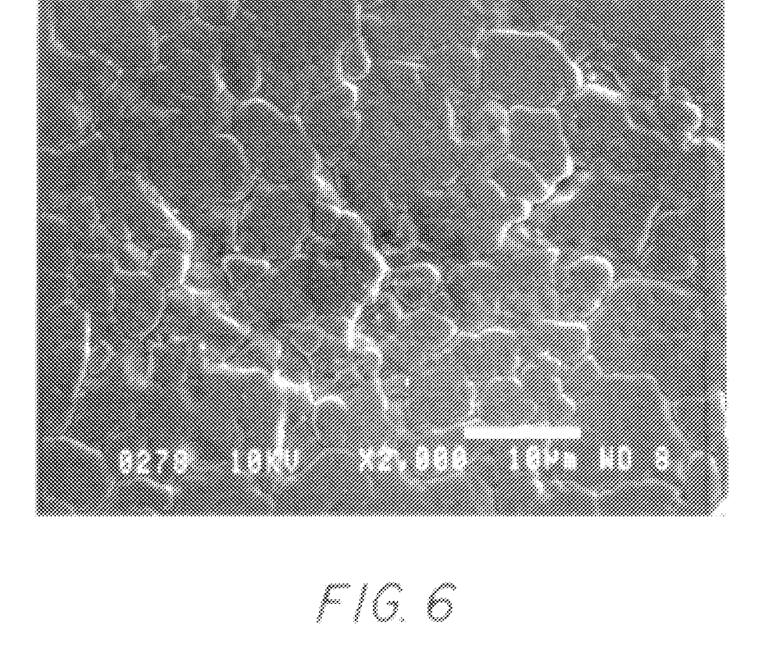
FIG. 6 is a scanning electron beam photomicrograph (magnified 2000x) of a coated area (prior to testing) of a lanchette.
Figure 7:
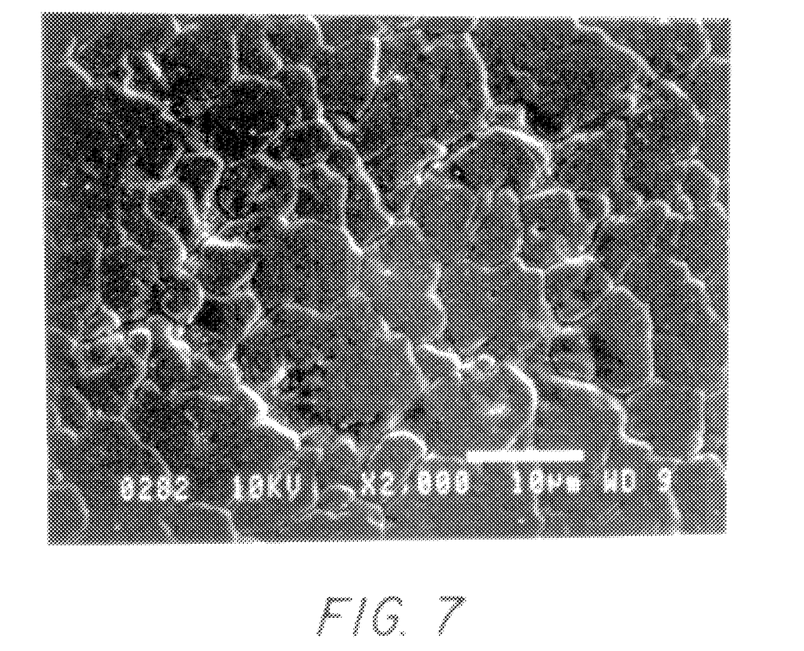
FIG. 7 is a scanning electron beam photomicrograph (magnified 2000x) of a coated area (after testing) of a lanchette.
Figure 8:
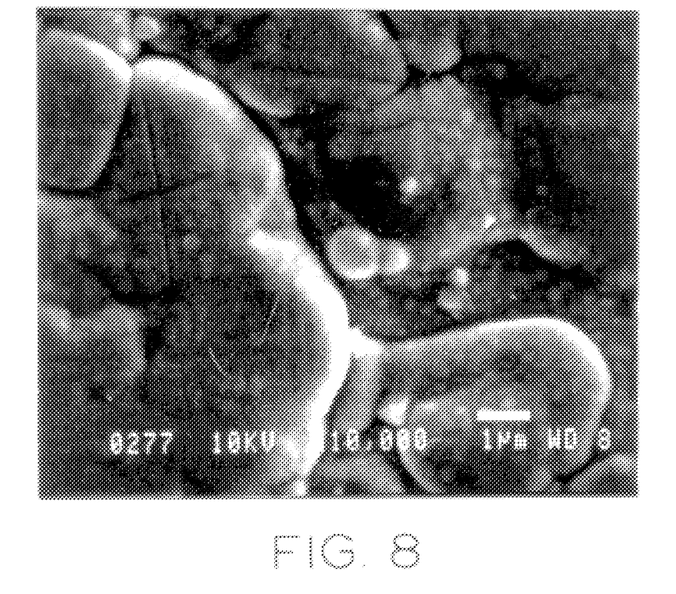
FIG. 8 is a scanning electron beam photomicrograph (magnified 10000x) of a coated area (prior to testing) of a planchette.
Figure 9:
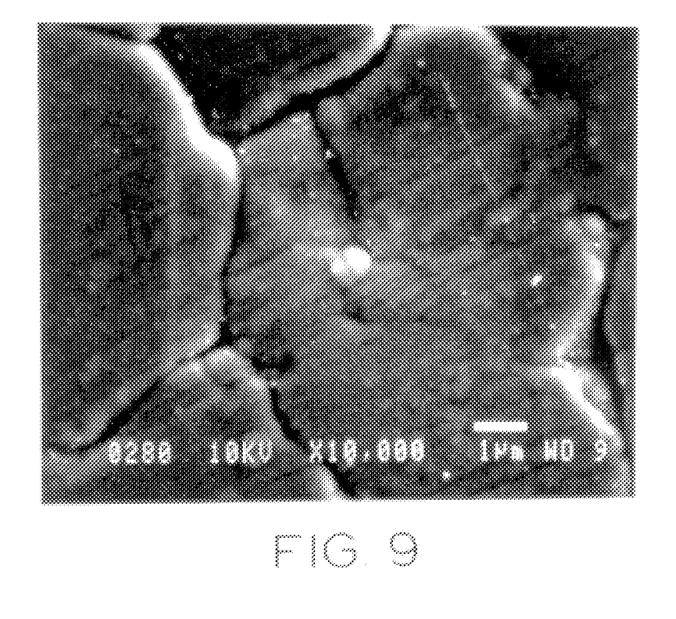
FIG. 9 is a scanning electron beam photomicrograph (magnified 10000x) of a coated area (after testing) of a planchette.

FIG. 6 shows coated portion 34 of planchette 30 before the test. FIG. 7 shows coated portion 44 (different area) of the planchette after the test. In FIGS. 8 and 9, magnified portions of coated portion 44, even at 10,000× magnification, demonstrate that there is no evidence of deposit on the Ta$_2$O$_5$ coated 304 stainless steel, FIG. 8 representing the 0.4 micron thick coated sample before the test and FIG. 9 representing the sample after the JET-A fuel test at 950° F. and 435 p.s.i.a., 0.08 pph for 7 hours. Clearly the Ta$_2$O$_5$ prevented contact between chromium in the metal and sulfur in the fuel. No other type of deposit was observed on the coating.

Figure 10:
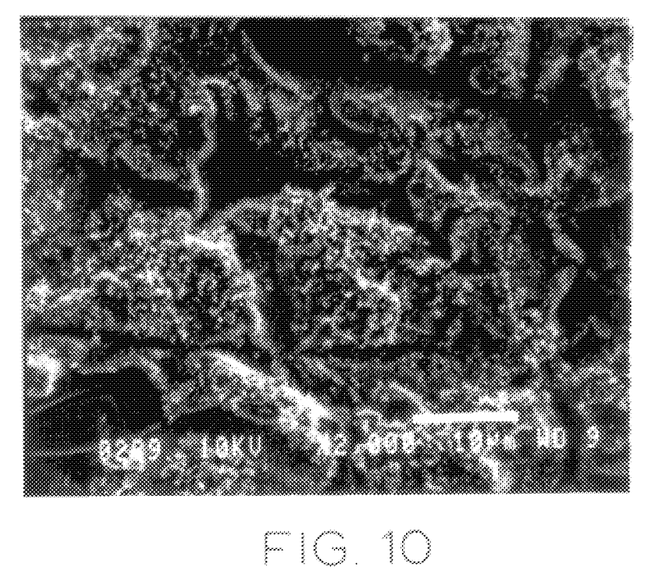
FIG. 10 is a scanning electron beam photomicrograph (magnified 2000x) of an uncoated area (after testing).
Figure 11:
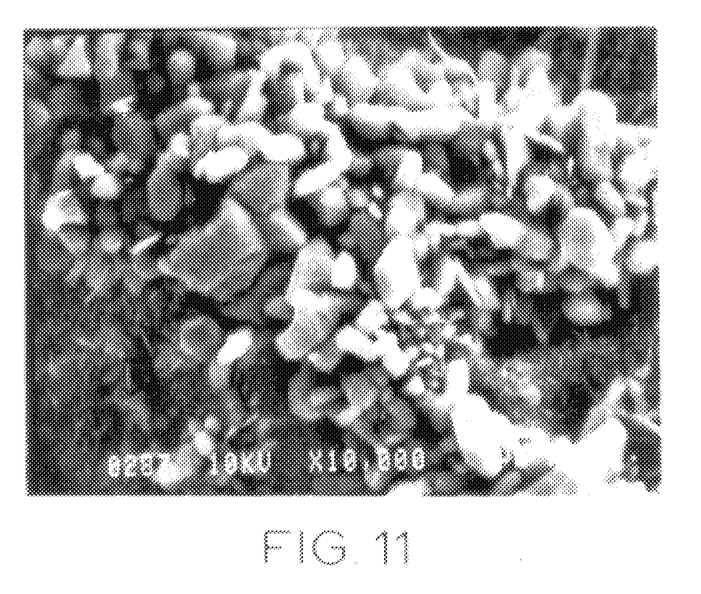
FIG. 11 is a scanning electron beam photomicrograph (magnified 10000x) of an uncoated area (after testing).

FIGS. 10 and 11 show scanning electron beam photomicrographs of an uncoated part of a planchette at a magnification of 2,000× and 10,000×, respectively, after testing in Jet-A fuel at 950° F. and 435 p.s.i.a., 0.08 pph for 7 hours. The figures show crystals of chromium sulfide and "fuzz" attributed to coke polymerization. An analysis showed 50/50 carbon/sulfur in the deposits.

Tests similar to those above were conducted at 700° F. and 100 p.s.i.a. for 10 hours using boiling Jet-A fuel. For this test, air was bubbled into the liquid fuel to increase oxygen concentration. The results were identical to those shown in FIG. 3 insofar as deposits formed on the uncoated portion, and no deposit formed on the Ta$_2$O$_5$ coated portion.

The foregoing clearly establishes that the use of coating material of the present invention prevents diffusion between the substrate and the hydrocarbon with subsequent chemical reaction leading to surface deposit formations.

Based on the foregoing results, it is further evident to one skilled in the art that similar diffusion barrier results can be obtained with other metal oxides on other substrate materials.

Preferred catalytic coatings are zirconium oxide (ZrO$_2$). This coating is applied to a cleaned substrate in a vacuum furnace by placing zirconium di-isopropoxide diacetylacetonate in a furnace containing the substrate and heating the furnace at about 400° C. to about 450° C. under the conditions as described above for the effusive CVD of tantalum oxide on a planchette.

It is not necessary that the ZrO$_2$ coating be atomically tight since it does not have to form a diffusion barrier between metal atoms in the metal substrate and impurities in the fuel.

While other modifications of the invention and variations thereof which may be employed within the scope of the invention, have not been described, the invention is intended to include such modifications as may be embraced within the following claims.

What is claimed is:

1. A method for preventing the deposit on a metal surface of hydrocarbon degradation products derived from sulfur- or oxygen-containing hydrocarbon fluid, the method comprising the steps of processing the metal surface to be clean and oxide-free, and then applying to the clean and oxide-free metal surface a coating comprising a catalytic, smooth, continuous, non-porous, and thermally stable layer of zirconium oxide which inhibits formation of gum on a surface thereof, the layer of zirconium oxide being deposited by chemical vapor deposition from an organometallic precursor vapor without use of a carrier gas.

2. A method according to claim 1 wherein the metal surface is an iron-, nickel- or chromium-containing metal surface and wherein the coating consists essentially of zirconium oxide.

3. A method according to claim 1 in which the coating further comprises a smooth, non-porous, continuous amorphous metal oxide diffusion barrier layer, the layer of zirconium oxide constituting an outer layer of the coating for contact with the hydrocarbon fluid, the diffusion barrier layer and the layer of zirconium oxide both being applied by chemical vapor deposition from an organometallic precursor without use of a carrier gas.

4. The method according to claim 3 in which the diffusion barrier layer is amorphous tantalum oxide.

5. The method according to claim 3 in which the zirconium oxide layer is deposited by chemical vapor deposition from a precursor consisting essentially of zirconium diisopropoxide diacetylacetonate at a temperature between about 350° C. and about 425° C. and the diffusion barrier layer is deposited by chemical vapor deposition from a precursor consisting essentially of tantalum ethoxide at a temperature between about 400° C. and about 460° C., both depositions being carried out at a pressure of about 50 to 500 milliTorr.

6. The method according to claim 3 in which the diffusion barrier layer is silica.

7. A container article for hydrocarbon fluids having iron-, nickel-, or chromium-containing metal walls and a smooth, non-porous, continuous, thermally stable, and gum-inhibiting coating comprising a catalytic layer of zirconium oxide between the walls and the hydrocarbon fluid, the layer of zirconium oxide being deposited by chemical vapor deposition from an organometallic precursor vapor without use of a carrier gas such that the layer of zirconium oxide is smooth, non-porous, continuous and thermally-stable and inhibits gum deposits.

8. A container article according to claim 7 for contact with hot hydrocarbon fluids at temperatures above about 300° F., the coating further comprising a smooth, non-porous, continuous amorphous metal oxide diffusion barrier layer consisting essentially of amorphous tantalum oxide, the layer of zirconium oxide constituting a gum-inhibiting catalytic outer layer of the coating for contact with the hydrocarbon fluid.

9. A containment system for hot hydrocarbon fluids and comprising the container article of claim 7, the containment system comprising components which contact the fluid at temperatures above about 300° F., the components having metal surface areas having thereon a gum and coke resistant coating comprising a diffusion barrier layer consisting essentially of amorphous tantalum oxide deposited on the metal surface areas and a catalytic layer consisting essentially of zirconium oxide deposited on the tantalum oxide diffusion barrier layer.

10. A containment system according to claim 9 including a heat exchange component for cooling a high pressure turbine nozzle.

11. A container article according to claim 7 for contact with hot hydrocarbon fluids at temperatures above about 300° F., the coating further comprising a smooth, non-porous, continuous amorphous oxide diffusion barrier layer consisting essentially of silica, the layer of zirconium oxide constituting a gum-inhibiting catalytic outer layer of the coating for contact with the hydrocarbon fluid.

12. A containment system for hot hydrocarbon fluids and comprising the container article of claim 7, the containment system comprising components which contact the fluid at temperatures above about 300° F., the components having metal surface areas having thereon a gum and coke resistant coating comprising a diffusion barrier layer consisting essentially of silica deposited on the metal surface areas and a catalytic layer consisting essentially of zirconium oxide deposited on the silica diffusion barrier layer.

13. A containment system according to claim 12 including a heat exchange component for cooling a high pressure turbine nozzle.

\* \* \* \* \*